United States Patent
Cloudman et al.

(10) Patent No.: US 6,775,812 B2
(45) Date of Patent: Aug. 10, 2004

(54) LAYOUT DESIGN PROCESS AND SYSTEM FOR PROVIDING BYPASS CAPACITANCE AND COMPLIANT DENSITY IN AN INTEGRATED CIRCUIT

(75) Inventors: John Andrew Francis Cloudman, Fort Collins, CO (US); Jonathan Lachman, Fort Collins, CO (US); Nicholas Michell, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 47 days.

(21) Appl. No.: 10/197,346

(22) Filed: Jul. 17, 2002

(65) Prior Publication Data

US 2004/0015802 A1 Jan. 22, 2004

(51) Int. Cl.[7] .............................................. G06F 17/50
(52) U.S. Cl. .............................. 716/10; 716/8; 716/9; 716/11
(58) Field of Search .......................... 716/8–14, 1, 19

(56) References Cited

U.S. PATENT DOCUMENTS

| | | | |
|---|---|---|---|
| 6,009,251 A | | 12/1999 | Ho et al. |
| 6,096,580 A | * | 8/2000 | Iyer et al. .................... 438/132 |
| 6,289,412 B1 | | 9/2001 | Yuan et al. |
| 6,321,371 B1 | * | 11/2001 | Yount, Jr. ...................... 716/17 |
| 6,350,693 B2 | | 2/2002 | Chang et al. |
| 6,355,558 B1 | | 3/2002 | Dixit et al. |
| 6,378,110 B1 | | 4/2002 | Ho |
| 6,396,096 B1 | * | 5/2002 | Park et al. ................... 257/296 |
| 6,459,331 B1 | * | 10/2002 | Takeuchi et al. ............. 327/554 |
| 6,574,140 B2 | * | 6/2003 | Caywood ................ 365/185.06 |
| 6,591,406 B2 | * | 7/2003 | Ishikawa ......................... 716/8 |
| 2002/0107396 A1 | * | 8/2002 | Meier et al. ................... 326/37 |
| 2002/0131291 A1 | * | 9/2002 | Kurjanowicz et al. ......... 365/69 |

OTHER PUBLICATIONS

M. Armacost et al., "Plasma–etching processes for ULSI semiconductor circuits," IBM Journal of Research and Development. vol. 43, 1/2, 1999, 31 pages.

* cited by examiner

Primary Examiner—Vuthe Siek

(57) ABSTRACT

An IC layout design process and system involves placing an adjustable capacitor cell having a plurality of sub-cells, each with a polysilicon shape disposed over a corresponding active area shape. The polysilicon shapes are electrically coupled to a first power rail and the active area shapes are electrically coupled to a second power rail. The sub-cells of the adjustable capacitor cell are operable to be modified to satisfy a density measurement associated with the IC's fabrication flow.

34 Claims, 8 Drawing Sheets

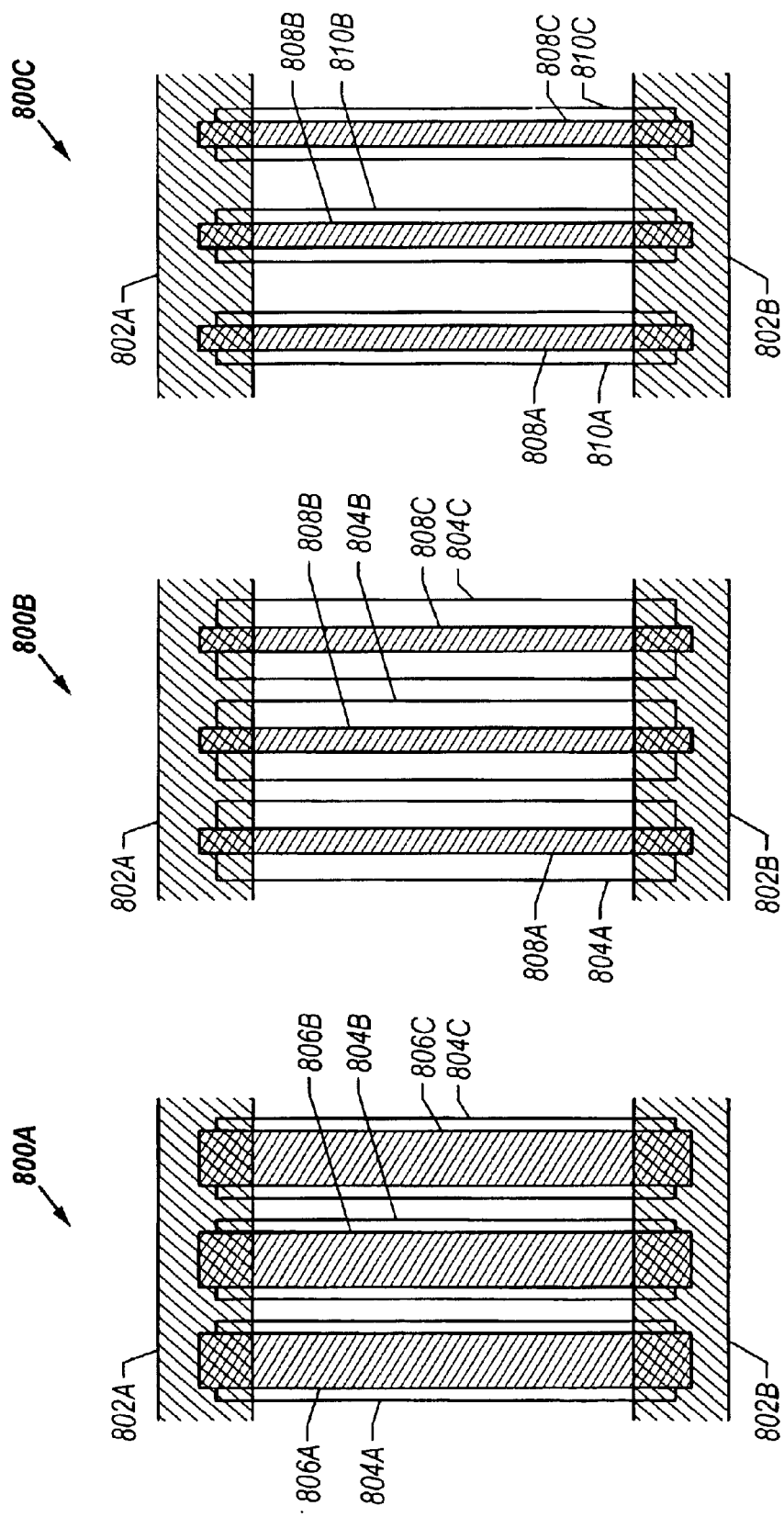

LAYOUT DESIGN PROCESS AND SYSTEM FOR PROVIDING BYPASS CAPACITANCE AND COMPLIANT DENSITY IN AN INTEGRATED CIRCUIT

BACKGROUND OF THE INVENTION

1. Technical Field of the Invention

The present invention generally relates to the field of integrated circuit (IC) design and layout verification. More particularly, and not by way of any limitation, the present invention is directed to a layout design process and system for providing bypass capacitance and compliant densities in an IC chip.

2. Description of Related Art

Modern IC technologies require active area and polysilicon densities to be within certain upper and lower bounds. Such technologies typically use fill features involving the active area and/or polysilicon layers in order to achieve density compliance. These fill features, while improving manufacturability of the IC device, offer no electrical advantage. In particular, where stringent minimum bypass capacitance requirements are imposed on a circuit, merely providing electrically inactive fill features is not a viable solution. On the other hand, if a circuit layout is designed with a view to maximize its bypass capacitance, the densities may be out of bounds.

SUMMARY OF THE INVENTION

Accordingly, the present invention advantageously provides a layout design process and system for providing bypass capacitance and compliant densities in an IC chip without the aforementioned deficiencies. In one embodiment, an adjustable capacitor cell is provided as a plurality of sub-cells, each with a polysilicon shape disposed over a corresponding active area shape. The polysilicon shapes are electrically coupled to a first power rail and the active area shapes are electrically coupled to a second power rail. The sub-cells of the adjustable capacitor cell are operable to be modified to satisfy a density or electrical measurement associated with the IC.

BRIEF DESCRIPTION OF THE DRAWINGS

A more complete understanding of the present invention may be had by reference to the following Detailed Description when taken in conjunction with the accompanying drawings wherein:

FIGS. 8A–8C depict further embodiments of an adjustable capacitor cell of the present invention.

DETAILED DESCRIPTION OF THE DRAWINGS

Figure 1:
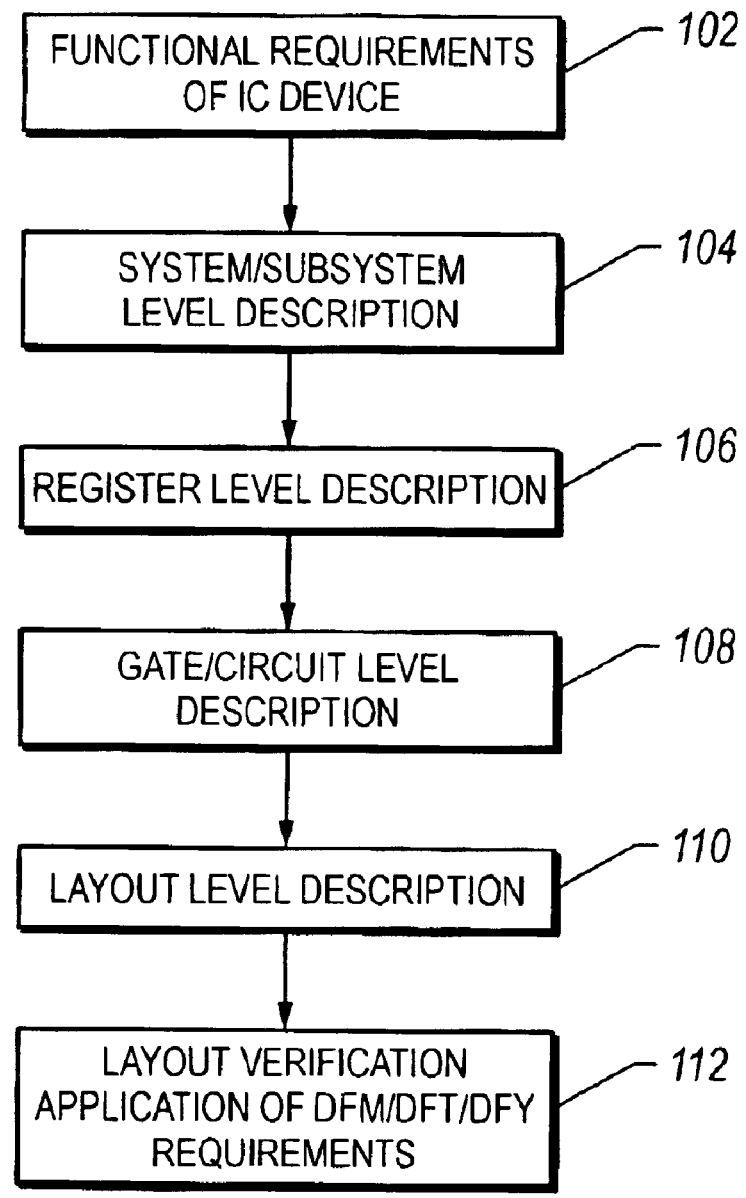
FIG. 1 depicts an embodiment of IC design flow wherein the teachings of the present invention may be advantageously practiced for obtaining acceptable bypass capacitance while complying with density requirements.

In the drawings, like or similar elements are designated with identical reference numerals throughout the several views thereof, and the various elements depicted are not necessarily drawn to scale. Referring now to FIG. 1, depicted therein is an embodiment of IC design flow wherein the teachings of the present invention may be advantageously practiced for obtaining acceptable bypass capacitance in an IC device while complying with density requirements that may be imposed due to fabrication process considerations. Upon defining broad functional requirements of the IC device (block 102), well known electronic design automation (EDA) and related computer aided design (CAD) techniques are utilized to reduce the large, often complex functional requirements into various systems and subsystems, with appropriate functional descriptions at lower levels (block 104). In a computer-implemented iterative process, further reductions of the functionality requirements are made so as to attain structural constructs that satisfy the design objectives. Thus, various levels of hardware abstraction are obtained, e.g., register level (block 106), gate/circuit level (block 108), and layout level (block 110). Within these processes, a high level design language description of the IC (e.g., HDL, VHDL, Verilog, et cetera) is translated by a computer system into a netlist of generic logic. The generic logic can then be translated into a netlist of technology-specific gates and interconnections therebetween. Thereafter, a physical design tool is commonly used to place and route the actual logic, physical pinouts, wiring, and interconnects according to the circuit design in order to produce a physical layout of the semiconductor IC.

As is well known, most EDA/CAD systems support a layout editor for generating a layout database which provides a geometric design of an IC device. A layout database may be represented in a standard format such as the Cal-Tech Intermediate Format (CIF), or the GDS2 standard format, or in some other proprietary format. A layout database typically includes geometric parameters associated with geometric objects, or geometries, (e.g., polygons, etc.), specifying the position and dimension of different layers of materials to be deposited on a silicon wafer. The geometries are typically converted into respective rectangles arranged according to their physical location and commonly represented by parameter values in the form of coordinates.

The layout of an IC design may be described in terms of a symbolic layout, or logical layout, rather than in terms of the actual geometry of the masks and layers that comprise the chip. A symbolic layout provides a higher level of abstraction than a mask layout, and is therefore easier to manipulate. In a symbolic layout, primitive components of an IC design may be organized in groups referred to as "cells", and the layout may be described in terms of the cells and their relative placement and interconnection. A cell that contains only primitive symbols (i.e. transistors, wires, capacitors and other physical components) is referred to as a "leaf cell".

Once the IC design has been placed and routed, a battery of tests may be performed on the resultant layout to ensure that various design/process/fabrication requirements are met. These tests are performed as part of a process called layout verification (block 112), an important last step before the IC design is committed to silicon. In one implementation, such post-layout IC verification processes include layout parasitic extraction (LPE), design rule checking (DRC), and connectivity analysis. Design rules ensure that an IC layout design is functional and capable of manufacture (e.g., design rules may prohibit a circuit layout from being designed with short circuits). IC analysis may also be performed to verify that the electrical interconnections of a semiconductor chip correspond to an originally intended design once it has been determined that the design rules have been followed correctly (i.e., connectivity analysis). Additionally, requirements that arise due to advanced process technologies and application of practices such as design for manufacturability (DFM), design for test (DFT), design for yield (DFY), and the like, are also verified in a post-layout verification process in a computer-implemented iterative manner as will be described in additional detail hereinbelow with respect to one embodiment of the present invention.

Figure 2A:
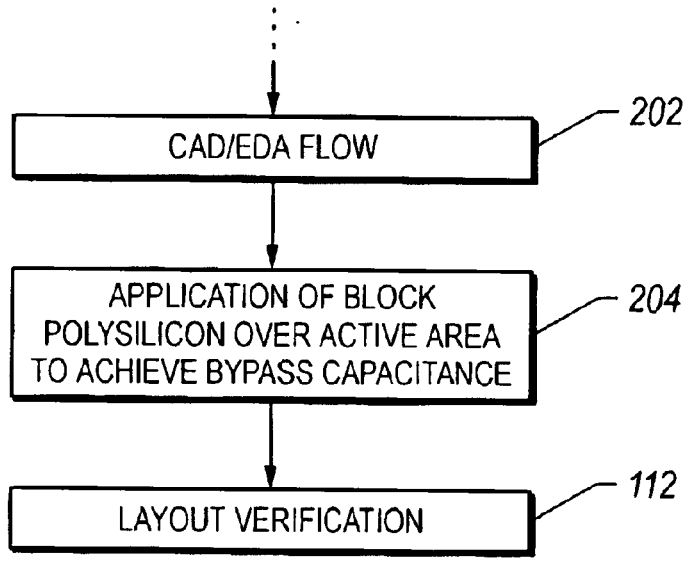
FIGS. 2A and 2B (Prior Art) depict two current IC design flow embodiments.
Figure 2B:
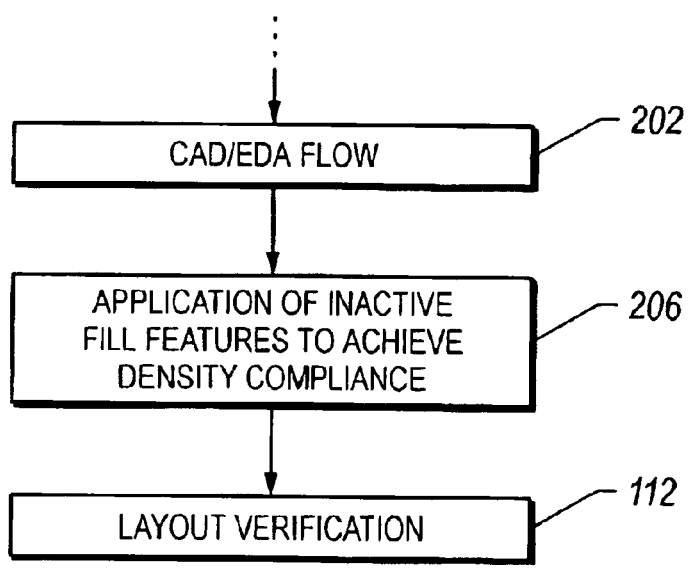

As pointed out in the Background section of the present patent application, modern IC fabrication techniques impose certain upper and lower limits on polysilicon and active area densities of an IC chip. In addition, there are countervailing electrical requirements such as minimum bypass capacitance that are affected by the amounts of polysilicon and active area in a chip. FIGS. 2A and 2B depict two conventional design flows that attempt to manipulate the layout design of a chip in order to achieve compliance with respect to these requirements. As usual, a CAD/EDA flow is employed (block 202) as set forth in detail hereinabove in order to design the chip. The flow exemplified in FIG. 2A relates to the condition where the designers attempt to ensure that the minimum bypass capacitance requirement of the chip is met. Since it is not known beforehand as to what the final polysilicon and active area densities will be upon fabrication, the layout design is manipulated so as to achieve a maximized bypass capacitance, typically by way of applying a large block of polysilicon over active area (block 204), that is certain to meet the minimum requirements. Whereas such a methodology is capable of ensuring that the capacitance measurements are met, it is likely to generate density violations (e.g., polysilicon density being greater than the recommended maximum level) during verification (block 112).

Referring now in particular to FIG. 2B, another design approach to balance polysilicon/active area densities with capacitance requirements in a chip is depicted. Again, a normal CAD/EDA flow may be employed for designing the chip's circuitry (block 202). To meet density requirements, a number of fill features involving polysilicon and/or active area layers are provided in the chip layout (block 206). Although such fill features can provide compliance with respect to polysilicon and active area densities, they do not offer any electrical functionality. Accordingly, such a design can fail capacitance tests in a post-layout verification process (block 112).

Figure 3:
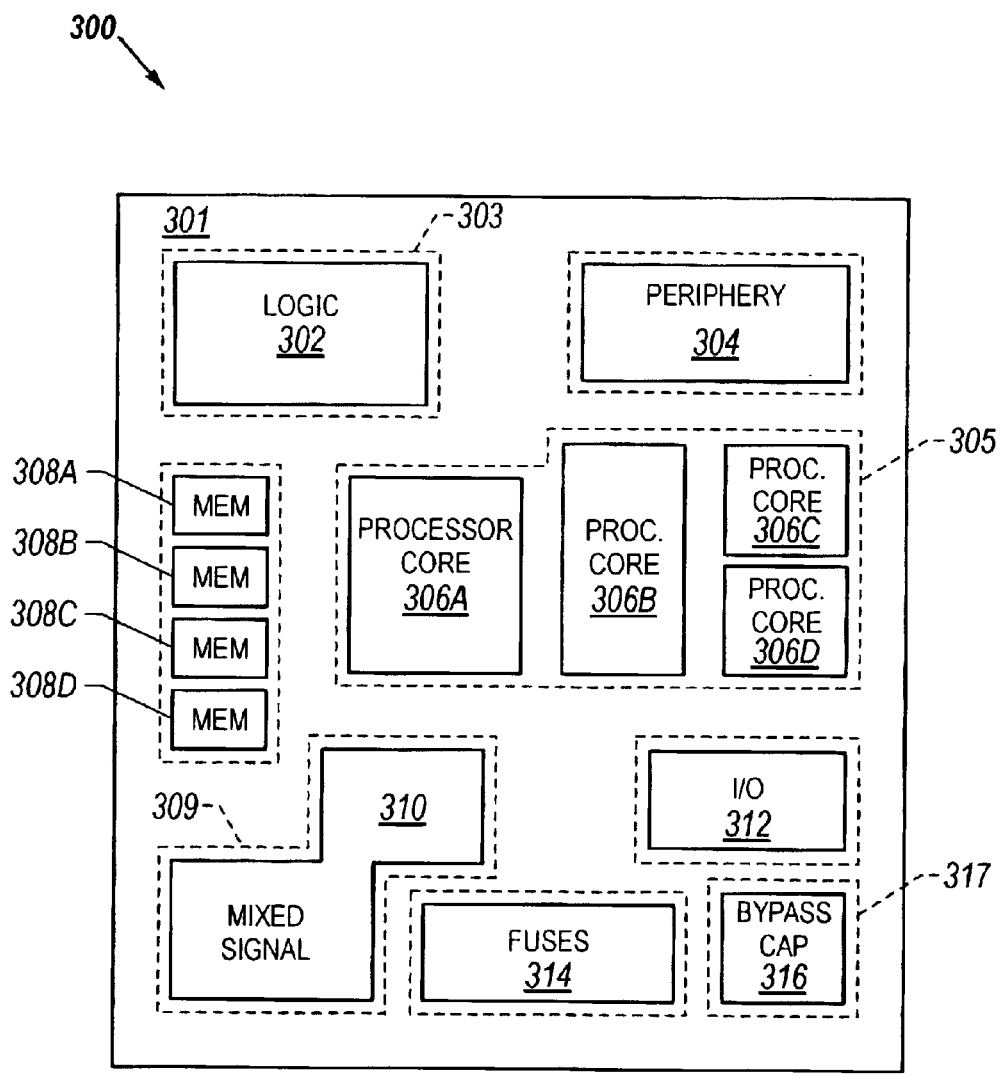
FIG. 3 (Prior Art) depicts a floor plan layout of an exemplary IC having a conventional bypass capacitance arrangement.

FIG. 3 depicts a floor plan layout of an IC embodiment 300 having a conventional bypass capacitance arrangement. Those skilled in the art will recognize that the layout of IC 300 shown in this FIG. is a highly simplified representation that is illustrative of the various constituent sub-designs that the IC may have. Further, each exemplary sub-design is shown with two layers, a polysilicon layer and an active area layer, for purposes of illustration. Reference numeral 301 refers to the entire area of the chip wherein the different constituent sub-circuits are disposed. A logic block is illustrated as a polysilicon area 302 disposed over an active area 303. Likewise, polysilicon areas associated with a periphery block 304, processor cores 306A–D, memory blocks 308A–D, a mixed signal circuitry block 310, input/output (I/O) block 312, and a fuse block 314 are illustrated. Dashed line boundaries around the respective polysilicon areas exemplify the active areas associated therewith. For instance, reference numeral 305 refers to the active area associated with the polysilicon areas 306A–D of the exemplary processor block. Likewise, reference numeral 309 refers to the active area associated with the polysilicon area 310 of the mixed signal block.

The chip's bypass capacitance is provided by way of a conventional capacitor structure having an aggregated polysilicon area 316 over a defined active area 317. As is well known, the capacitor's polysilicon and active areas are respectively coupled to two power rails (not shown) for providing the requisite capacitive functionality. It should be apparent to those skilled in the art that the bypass capacitor arrangement of the chip 300 may be one that is designed with a view to maximize the capacitance of the chip. However, as pointed out hereinabove, the polysilicon density (sum of all polysilicon areas over the chip area 301) and the active area density (sum of all active areas over the chip area 301) in such as a layout design can violate the density requirements.

Figure 4:
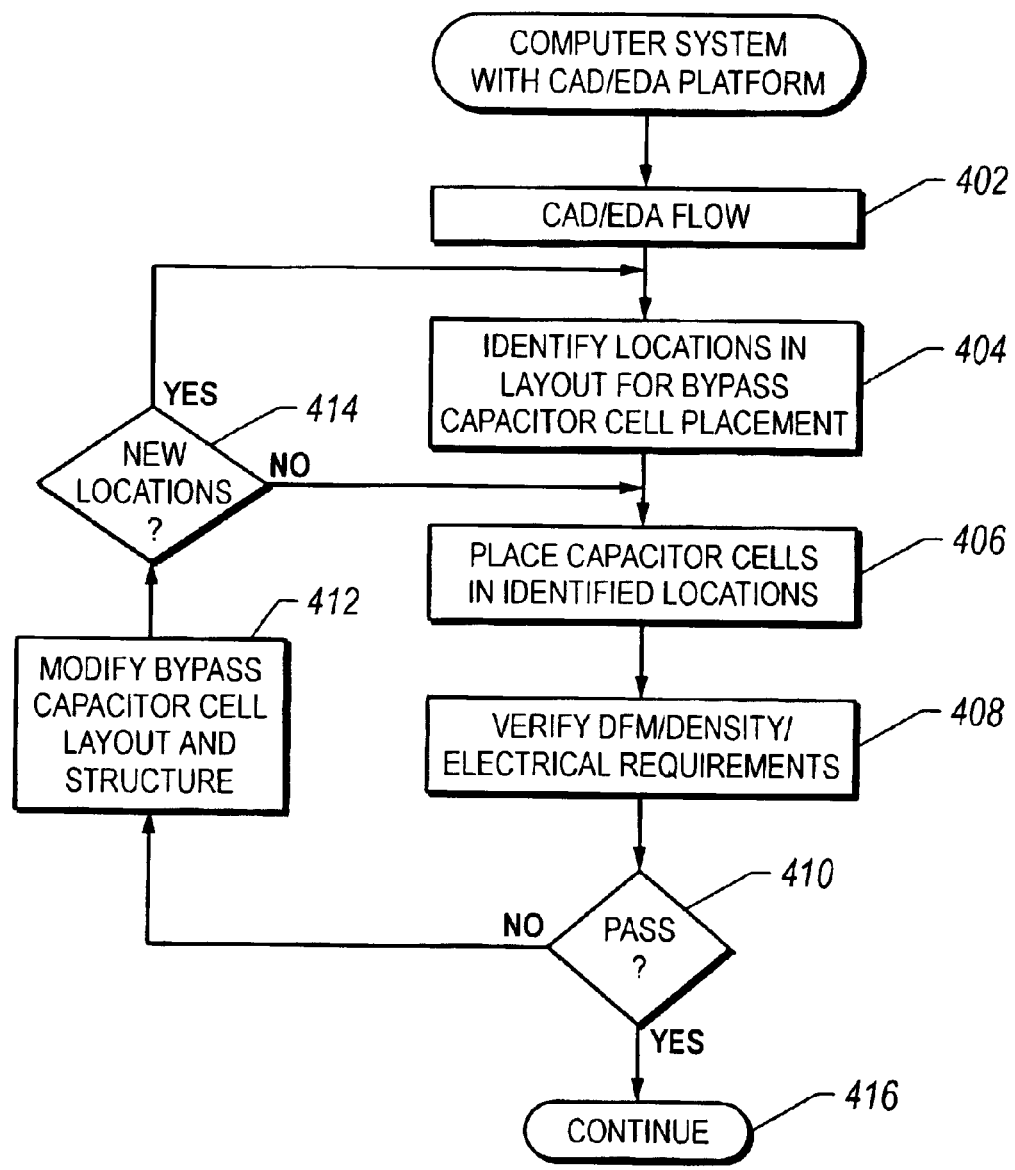
FIG. 4 depicts a flow chart of the various operations involved in an embodiment of the design flow methodology of the present invention for achieving electrical functionality (e.g., bypass capacitance) as well as compliance with manufacturability requirements such as density measurements.

Referring now to FIG. 4, depicted therein is a flow chart of the various operational blocks involved in an embodiment of the design flow methodology of the present invention for achieving compliance with manufacturability requirements such as polysilicon density as well as electrical functionality requirements such as bypass capacitance. As will be described in additional detail hereinbelow, the present invention provides a "smart" capacitor cell design having a number of sub-cells wherein the polysilicon and active area components of the capacitor cell can be iteratively adjusted based on verification results.

In an embodiment, the layout design scheme of the present invention is provided as a computer-implemented process with associated computer-accessible medium operable on a computer system. The design flow provides for an adjustable capacitor cell that is modulated in order to achieve a compliant polysilicon density measurement with respect to a particular fabrication flow such as, e.g., chemical mechanical polishing (CMP).

A technology-specific CAD/EDA flow is employed for designing an IC's layout with required functionality (block 402). As part of the layout process, a single bypass capacitor cell with adjustable sub-cells is designed for placement in the layout. In one embodiment, the single bypass capacitor cell is comprised of a plurality of smaller sub-cells with sparsely placed polysilicon-to-power rail connections. Since a gate polysilicon-to-active area capacitor device can be constructed in numerous known methods based on application and technology, the patterning of the single cell bypass capacitor structure may be arranged in multiple ways. For instance, in one implementation, the smaller sub-cells of the capacitor cell may be arranged as stripes of active area, with narrow stripes of polysilicon on top of the active area stripes.

As part of the layout design flow, one or more locations in the layout are identified for placing the bypass capacitor cell (block 404). Essentially, such placement may be localized to areas where there is no interfering circuitry. Also, the capacitor cells may be disposed near fast-switching circuit elements that require protection from noise in power supply voltages. In another exemplary implementation, the capacitor cells may be placed in the router channels of the layout design.

Upon placement of the adjustable bypass capacitor cells in identified locations (block 406), various tests may be carried out in order to verify whether the resultant layout design satisfies the density requirements, capacitance ranges, and the like, depending upon application and fabrication technology (such as, for example, chemical mechanical polishing (CMP)). These verification processes are consolidated as block 408 in the flow chart.

If a measurement fails the requisite test as determined by decision block 410 (e.g., out-of-range polysilicon density, low bypass capacitance, et cetera), the adjustable capacitor cell structure can be modified by varying its active area and/or polysilicon area components (block 412). As a result, the number of sub-cells of the capacitor cell may be adjusted also. A further determination may be made whether the capacitor cell location(s) in the layout may have to be modified (decision block 414). If so, new locations are then identified for capacitor cell placement. Otherwise, the cells are placed in the previously-identified locations for further testing. These processes may be performed iteratively, without significant re-layout effort, until the layout passes the requirements. The flow then continues with the next stage of the design process (block 416).

Figure 5:
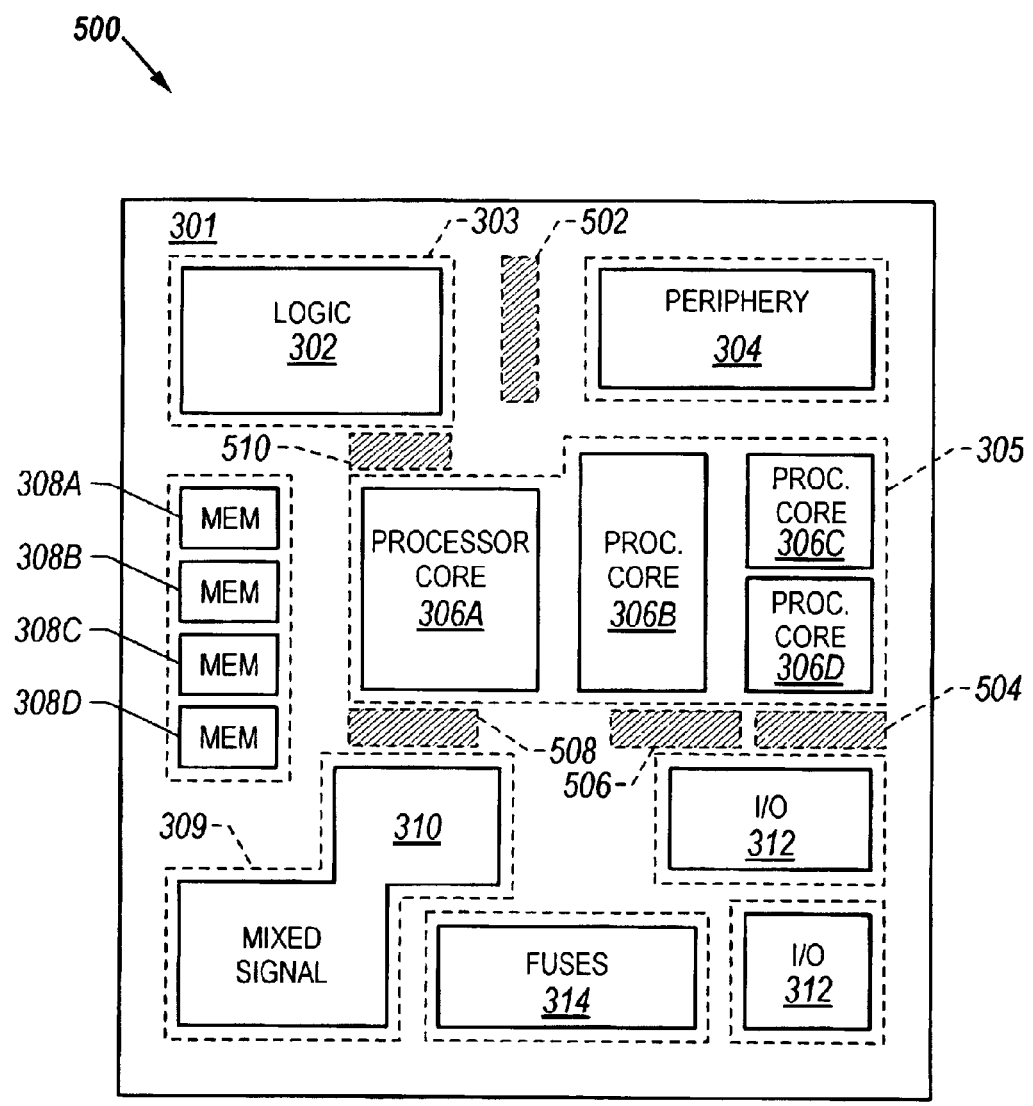
FIG. 5 depicts a floor plan layout of an IC embodiment having a bypass capacitance arrangement in accordance with the teachings of the present invention.

FIG. 5 depicts a floor plan layout of an IC 500 embodiment having a bypass capacitance arrangement in accordance with the teachings of the present invention. As before, a plurality of sub-circuits are disposed on the chip area 301, wherein the polysilicon and active area layers are exemplified in a highly simplified representation for purposes of illustration. Instead of a large bypass capacitor block having a maximized capacitance, a number of adjustable capacitor cells are disposed in the non-interfering portions of the chip layout. For instance, a bypass capacitor cell 502 is placed between the logic and periphery portions. Likewise, exemplary capacitor cells 504 and 506, 508, and 510 are located in spaces between the processor and I/O blocks, the processor and mixed signal circuitry blocks, and between the logic and processor blocks, respectively.

Figure 6:
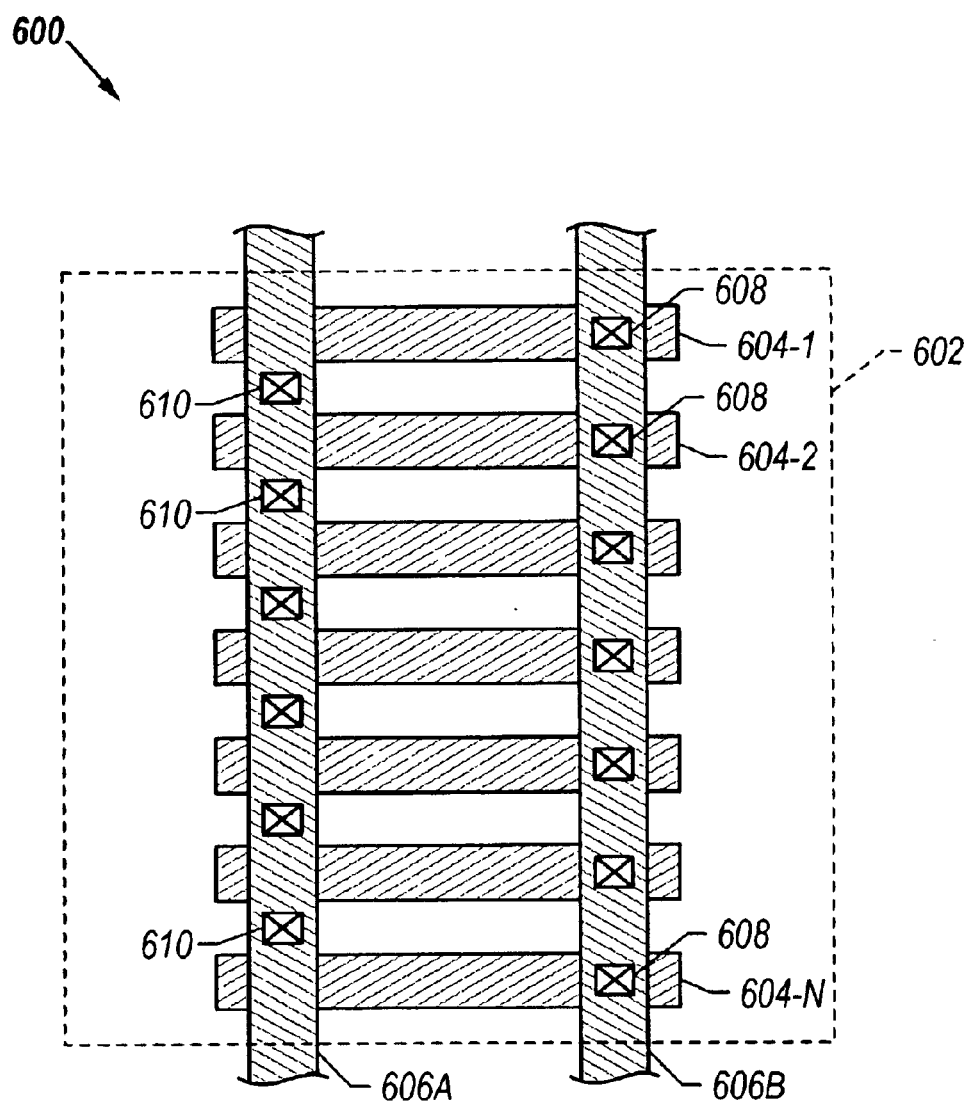
FIG. 6 depicts an embodiment of an adjustable capacitor cell for providing bypass capacitance in accordance with the teachings of the present invention.

FIG. 6 depicts an embodiment of an adjustable capacitor cell 600 for providing bypass capacitance in accordance with the teachings of the present invention, wherein a gate polysilicon-to-active area capacitor structure is illustrated. A plurality of polysilicon stripes 604-1 through 604-N are disposed over an active area 602, with a suitable dielectric layer therebetween (not shown). Power rails 606A and 606B, comprised of a metal layer in one implementation, are electrically coupled to the active area and polysilicon stripes, respectively. In the exemplary embodiment shown, a contact layer is operable to support a plurality of contacts between the active area layer and power rail 606A and between the polysilicon layer and power rail 606B. Reference numeral 608 refers to an exemplary contact between the polysilicon and power rail 606B. Likewise, reference numeral 610 refers to an exemplary contact between the active area and power rail 606A.

Figure 7:
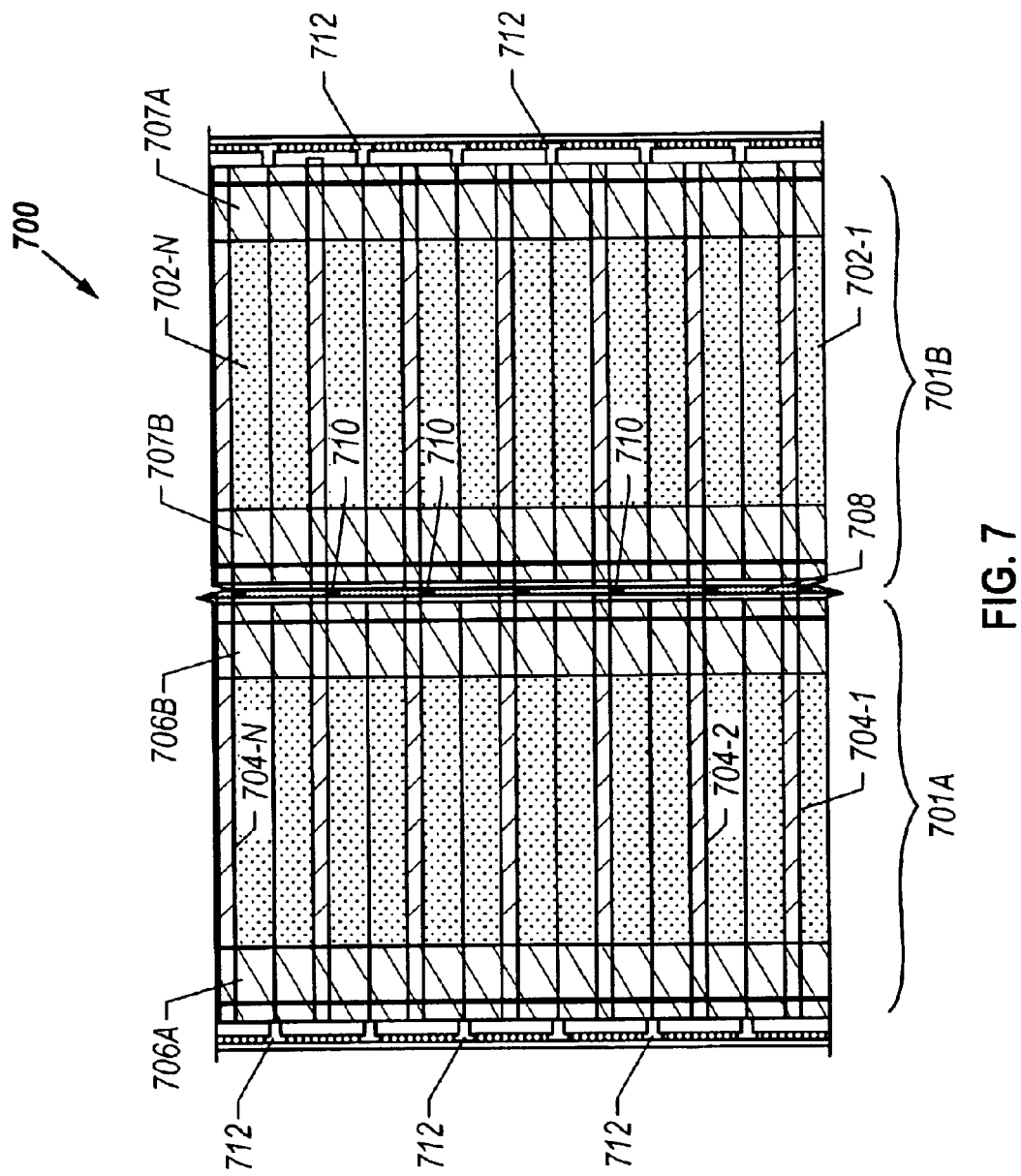
FIG. 7 depicts another embodiment of an adjustable capacitor cell for providing bypass capacitance in accordance with the teachings of the present invention.

FIG. 7 depicts another embodiment of an adjustable capacitor cell 700 for providing bypass capacitance in accordance with the teachings of the present invention. Again, the capacitor cell 700 is comprised of a plurality of narrow polysilicon stripes 704-1 through 704-N disposed over active area stripes 702-1 through 702-N, organized into two portions 701A and 701B. Each capacitor cell portion is provided with its own power rails for electrically coupling with the polysilicon and active area stripes. Power rails 706A and 706B are coupled to the active area layer and polysilicon layer of the capacitor cell portion 701A. Likewise, power rails 707A and 707B supply power to the active area layer and polysilicon layer of the capacitor cell portion 701B. A local interconnect layer is provided as part of the capacitor cell design for effectuating electrical connections. In one implementation, power connections to the polysilicon stripes may be made where the polysilicon extends beyond the active area. Likewise, the active area power connections may be made where the active area extends beyond the polysilicon. Reference numeral 708 refers to the local interconnect layer that couples the polysilicon stripes to centrally-disposed power rails 706B and 707B using a plurality of vias 710. In similar fashion, local interconnect vias 712 are provided between the active area layer and power rails 706A, 707A. Again, the power rails may be comprised of any known or heretofore unknown metal layers that can be disposed on multiple levels.

FIGS. 8A–8C depict further embodiments of an adjustable capacitor cell of the present invention wherein the geometries of either polysilicon, active area, or both may be modified for achieving density compliance and electrical functionality in accordance with the teachings of the present invention. In particular reference to FIG. 8A, embodiment 800A depicts the condition where polysilicon shapes 806A–C and underlying active area shapes 804A–C are comprised of rectangular stripes with substantially equal thickness. Reference numerals 802A and 802B refer to the two power rails, respectively. For purposes of clarity, no interconnects between polysilicon and power rail or between active area and power rail are shown in FIGS. 8A–8C. Embodiment 800B shown in FIG. 8B exemplifies the condition where the polysilicon shapes are modified while the active area shapes remain the same so as to achieve density compliance and/or bypass capacitance compliance. Reference numerals 808A–C refer to the narrower polysilicon stripes of embodiment 800B. Likewise, embodiment 800C shown in FIG. 8C exemplifies the condition where both polysilicon as well as active area geometries are modified, wherein reference numerals 810A–C refer to the narrower active area stripes.

Based upon the foregoing Detailed Description, it should be appreciated that the present invention provides an innovative design flow scheme, preferably computer-implemented, for providing bypass capacitance as well as compliant polysilicon and active area densities in an IC product without the shortcomings and drawbacks of the state-of-the-art solutions. Because the present invention's method obviates the need for inserting electrically useless features in order to bring sub-minimum density areas into compliance, it is no longer necessary to significantly modify the layout artwork so as to accommodate the fill features. With the use of the present invention's teachings, if there is a need to reduce or modify the active area and/or polysilicon density, individual structures within the bypass capacitor cell can be removed or otherwise adjusted. For example, by removing the sub-cell structures, densities of both active area and polysilicon can be reduced. Also, the polysilicon stripes can be narrowed, reducing only the polysilicon density. This methodology accordingly maximizes the effective area of bypass capacitors while achieving active area and Polysilicon densities within the prescribed limits without significant re-layout effort.

It is believed that the operation and construction of the present invention will be apparent from the foregoing Detailed Description. Although the invention has been described with reference to certain illustrations, it is to be understood that the forms of the invention shown and described are to be treated as exemplary embodiments only. Various changes, substitutions and modifications can be realized therein without departing from the scope of the present invention as set forth in the following claims.

What is claimed is:

1. An integrated circuit (IC) design process for providing bypass capacitance in an IC, comprising-the steps:
   identifying at least one location in said IC's layout; and
   placing an adjustable capacitor cell in said at least one location, said adjustable capacitor cell having a plurality of sub-cells, each with a polysilicon shape over a defined active area, wherein said polysilicon shapes are electrically coupled to a first power rail and said defined active areas are electrically coupled to a second power rail, further wherein said plurality of sub-cells are operable to satisfy a density measurement associated with said IC for a particular fabrication flow.

2. The IC design process as set forth in claim 1, further including the steps:
   verifying whether said IC's bypass capacitance is within a predetermined ranger and
   if not, iteratively modifying said capacitor cell until said IC's bypass capacitance is within said predetermined range.

3. The IC design process as set forth in claim 1, wherein said at least one location comprises a routing channel of said IC.

4. The IC design process as set forth in claim 1, wherein said at least one location comprises a location adjacent a layout location having a switching circuit portion.

5. The IC design process as set forth in claim 1, further including the steps:
   verifying whether said density measurement is within a predetermined range; and
   if not, iteratively modifying said capacitor cell until said density measurement is within said predetermined range.

6. The IC design process as set forth in claim 5, further including the steps:
   verifying whether said IC's bypass capacitance is within a predetermined range; and
   if not, iteratively modifying said capacitor cell until said IC's bypass capacitance is within said predetermined range.

7. The IC design process as set forth in claim 1, wherein said particular fabrication flow comprises a chemical mechanical polishing (CMP) flow.

8. The IC design process as set forth in claim 1, wherein said polysilicon shapes are electrically coupled to said first power rail via a local interconnect layer.

9. The IC design process as set forth in claim 1, wherein said defined active areas are electrically coupled to said second power rail via a local interconnect layer.

10. The IC design process as set forth in claim 1, wherein said first power rail comprises a metal rail.

11. The IC design process as set forth in claim 1, wherein said second power rail comprises a metal rail.

12. The IC design process as set forth in claim 1, wherein each of said defined active areas comprises a rectangular active area and each of said polysilicon shapes comprises a polysilicon stripe.

13. The IC design process as set forth in claim 1, wherein said density measurement comprises at least one of a polysilicon density measurement and an active area density measurement.

14. An integrated circuit (IC) design system for providing bypass capacitance in an IC, comprising:
   means for identifying at least one location in said IC's layout;
   means for placing an adjustable capacitor cell in said at least one location, said adjustable capacitor cell having a plurality of sub-cells, each with a polysilicon shape over a defined active area, wherein said polysilicon shapes are electrically coupled to a first power rail and said defined active areas are electrically coupled to a second power rail, further wherein said plurality of sub-cells are operable to satisfy a density measurement associated with said IC for a particular fabrication flow; and
   means for iteratively modifying said adjustable capacitor cell if at least one of said density measurement and said IC's bypass capacitance is outside a predetermined range.

15. The IC design system as set forth in claim 14, wherein said at least one location comprises a routing channel of said IC.

16. The IC design system as set forth in claim 14, wherein said at least one location comprises a location adjacent a layout location having a high-speed switching circuit portion.

17. The IC design system as set forth in claim 14, wherein said particular fabrication process comprises, a chemical mechanical polishing (CMP) flow.

18. The IC design system as set forth in claim 14, wherein said polysilicon shapes are electrically coupled to said first power rail via a local interconnect layer.

19. The IC design system as set forth in claim 14, wherein said defined active areas are electrically coupled to said second power rail via a local interconnect layer.

20. The IC design system as set forth in claim 14, wherein said first power rail comprises a metal rail.

21. The IC design system as set forth in claim 14, wherein said second power rail comprises a metal rail.

22. The IC design system as set forth in claim 14, wherein said each of defined active areas comprises a rectangular active area and each of said polysilicon shapes comprises a polysilicon stripe.

23. The IC design system as sat forth in claim 14, wherein said density measurement comprises at least one of a polysilicon density measurement and an active area density measurement.

24. A computer-accessible medium operable with a computer system, said computer-accessible medium carrying a sequence of instructions which, when executed by said computer system, cause the following steps to be performed as a computer-implemented integrated circuit (IC) design process for providing bypass capacitance and minimum density compliance is an IC:
   identifying at least one location in said IC's layout; and
   placing an adjustable capacitor cell in said at least one location, said adjustable capacitor cell, having a plurality of sub-cells, each with a polysilicon shape over at least one defined active area, wherein said polysilicon shapes are electrically coupled to a first power rail and said defined active areas are electrically coupled to a second power rail, further wherein said plurality of sub-cells are operable to satisfy a density measurement associated with said IC.

25. The computer-accessible medium for effectuating the computer-implemented IC design process as set forth in claim 24, further including the instructions to carry out the steps:

verifying whether said IC's bypass capacitance is within a predetermined range; and if not, iteratively modifying said capacitor cell until said IC's bypass capacitance is within said predetermined range.

26. The computer-accessible medium for effectuating the computer-implemented IC design process as set forth in claim 24, wherein said at least one location comprises a routing channel of said IC.

27. The computer-accessible medium for effectuating the computer-implemented IC design process as set forth in claim 24, wherein said at least one location comprises a location adjacent a layout location having a switching circuit portion.

28. The computer-accessible medium for effectuating the computer-implemented IC design process as set forth in claim 24, further including the instructions to carry out the steps:

verifying whether said density measurement is within a predetermined range; and if not, iteratively modifying said capacitor cell until said density measurement is within said predetermined range.

29. The computer-accessible medium for effectuating the computer-implemented IC design process as set forth in claim 26, further including the instructions to carry out the steps:

verifying whether said IC's bypass capacitance is within a predetermined range; and if not, iteratively modifying said capacitor cell until said IC's bypass capacitance is within said predetermined range.

30. The computer-accessible medium for effectuating the computer-implemented IC design process as set forth in claim 24, wherein said IC's density measurement is related to a fabrication flow including chemical mechanical polishing (CMP).

31. The computer-accessible medium for effectuating the computer-implemented IC design process as set forth in claim 24, wherein said polysilicon shapes are electrically coupled to said first power rail via a first local interconnect layer.

32. The computer-accessible medium for effectuating the computer-implemented IC design process as set forth in claim 24, wherein said defined active area is electrically coupled to said second power rail via a second local interconnect layer.

33. The computer-accessible medium for effectuating the computer-implemented IC design process as set forth in claim 24, wherein said each of defined active areas comprises a rectangular active area and each of said polysilicon shapes comprises a polysilicon stripe.

34. The computer-accessible medium for effectuating the computer-implemented IC design process as set forth in claim 24, wherein said density measurement comprises at least one of a polysilicon density measurement and an active area density measurement.

* * * * *